United States Patent
Shin et al.

(10) Patent No.: US 11,862,258 B2
(45) Date of Patent: Jan. 2, 2024

(54) MEMORY DEVICE AND OPERATING METHOD THEREOF

(71) Applicant: SK hynix Inc., Gyeonggi-do (KR)

(72) Inventors: Hyun Seob Shin, Gyeonggi-do (KR); Dong Hun Kwak, Gyeonggi-do (KR); Sung Hyun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 5 days.

(21) Appl. No.: 17/531,458

(22) Filed: Nov. 19, 2021

(65) Prior Publication Data

US 2022/0415419 A1    Dec. 29, 2022

(30) Foreign Application Priority Data

Jun. 25, 2021  (KR) .......................... 10-2021-0083213

(51) Int. Cl.
  *G11C 16/34* (2006.01)
  *G11C 16/10* (2006.01)
  *G11C 16/08* (2006.01)
  *G11C 16/26* (2006.01)
  *G11C 16/30* (2006.01)
  *G11C 16/16* (2006.01)

(52) U.S. Cl.
  CPC .......... *G11C 16/3459* (2013.01); *G11C 16/08* (2013.01); *G11C 16/102* (2013.01); *G11C 16/16* (2013.01); *G11C 16/26* (2013.01); *G11C 16/30* (2013.01); *G11C 16/3495* (2013.01)

(58) Field of Classification Search
  None
  See application file for complete search history.

(56) References Cited

U.S. PATENT DOCUMENTS

| | | | |
|---|---|---|---|
| 8,565,020 B2 | 10/2013 | Futatsuyama et al. | |
| 11,568,946 B2* | 1/2023 | Lee | G11C 11/5671 |
| 2018/0005696 A1* | 1/2018 | Kwon | G11C 16/30 |
| 2020/0233812 A1* | 7/2020 | Oh | G06F 12/0246 |

FOREIGN PATENT DOCUMENTS

| | | |
|---|---|---|
| KR | 10-2016-0124434 A | 10/2016 |
| KR | 10-2017-0052029 A | 5/2017 |

* cited by examiner

*Primary Examiner* — Kretelia Graham
(74) *Attorney, Agent, or Firm* — IP & T GROUP LLP

(57) ABSTRACT

An operating method of a memory device, comprises: a program operation of applying a program voltage to a selected word line to program selected memory cells connected to the selected word line, a first verification operation of applying a first verification voltage to the selected word line and applying a first verification pass voltage to unselected word lines to verify a first program state of the selected memory cells, and a second verification operation of applying a second verification voltage to the selected word line and applying a second verification pass voltage to the unselected word lines to verify a second program state higher than the first program state.

20 Claims, 11 Drawing Sheets

FIG. 11

| | PL1 | PL2 | PL3 | PL4 | PL5 |
|---|---|---|---|---|---|
| Vvfy1 | $6-2\triangle V-3\triangle V_2$ | $6-2\triangle V-2\triangle V_2$ | $6-2\triangle V-\triangle V_2$ | $6-2\triangle V$ | $6-2\triangle V$ |
| Vvfy2 | $6-\triangle V-3\triangle V_2$ | $6-\triangle V-2\triangle V_2$ | $6-\triangle V-\triangle V_2$ | $6-\triangle V$ | $6-\triangle V$ |
| Vvfy3 | 6 | 6 | 6 | 6 | 6 |

MEMORY DEVICE AND OPERATING METHOD THEREOF

CROSS-REFERENCE TO RELATED APPLICATION(S)

The present application claims priority under 35 U.S.C. § 119(a) to Korean Patent Application No. 10-2021-0083213, filed on Jun. 25, 2021, the disclosure of which is incorporated herein by reference in its entirety.

BACKGROUND

1. Field

Various embodiments of the present disclosure relate to a memory device and an operating method thereof.

2. Description of the Related Art

Recently, a computer environment paradigm has shifted to ubiquitous computing, which enables a computer system to be accessed anytime and everywhere. As a result, the use of portable electronic devices such as mobile phones, digital cameras, notebook computers and the like has increased. Such portable electronic devices typically use or include a memory system that uses or embeds at least one memory device, i.e., a data storage device. The data storage device can be used as a main storage device or an auxiliary storage device of a portable electronic device.

In a computing device, unlike a hard disk, a data storage device implemented as a nonvolatile semiconductor memory device is advantageous in that it has excellent stability and durability because it has no mechanical driving part (e.g., a mechanical arm), and has high data access speed and low power consumption. Examples of such a data storage device include a universal serial bus (USB) memory device, a memory card having various interfaces, and a solid state drive (SSD).

SUMMARY

Various embodiments of the present disclosure are directed to a memory device capable of narrowing a width of a threshold voltage distribution of programmed memory cells despite a source line bouncing phenomenon, and an operating method of the memory device.

In accordance with an embodiment of the present invention, an operating method of a memory device, may include: a program operation of applying a program voltage to a selected word line to program selected memory cells connected to the selected word line; a first verification operation of applying a first verification voltage to the selected word line and applying a first verification pass voltage to unselected word lines to verify a first program state of the selected memory cells; and a second verification operation of applying a second verification voltage, which has a higher level than the first verification voltage, to the selected word line and applying a second verification pass voltage, which has a higher level than the first verification pass voltage, to the unselected word lines to verify a second program state higher than the first program state of the selected memory cells.

In accordance with an embodiment of the present invention, a memory device may include: a memory block including a plurality of memory cells connected to a plurality of word lines; and a control circuit suitable for: programming selected memory cells connected to a selected word line among the plurality of word lines by applying a program voltage to the selected word line, applying a first verification pass voltage to unselected word lines while applying a first verification voltage to the selected word line to verify a first program state of the selected memory cells, and applying a second verification pass voltage, which is higher than the first verification pass voltage to the unselected word lines while applying a second verification voltage, which is higher than the first verification voltage to the selected word line to verify a second program state of the selected memory cells.

In accordance with an embodiment of the present invention, an operating method of a memory device, may include: programming selected memory cells within a memory block; and verifying a program state of the selected memory cells by applying a verification voltage to a selected word line coupled to the selected memory cells while applying a first verification pass voltage to a first unselected word line coupled to the memory block. The verifying may include increasing a level of the first verification pass voltage as a level of the verification voltage increases.

The method may further include decreasing the level of the first verification pass voltage as a number of unselected word lines coupled to the memory block becomes smaller. The programming and the verifying may not be yet performed on the unselected word lines.

The method may further include increasing the level of the first verification pass voltage as erase/write (E/W) cycles of the memory block become greater.

The method may further include repeating the programming and the verifying until the program state is verified as successful.

The method may further include increasing the level of the first verification pass voltage according to the repetition of the programming and the verifying.

The first unselected word line may be an unselected word line, on which the programming and the verifying are not yet performed.

The program state may be verified further by applying a second verification pass voltage, which is higher than the first verification pass voltage, to a second unselected word line, on which the programming and the verifying are successfully completed.

BRIEF DESCRIPTION OF THE DRAWINGS

FIG. 11 is a diagram illustrating lookup tables each including a program loop of the memory device and a verification voltage for each program state in accordance with an embodiment of the present disclosure.

DETAILED DESCRIPTION

Figure 1:
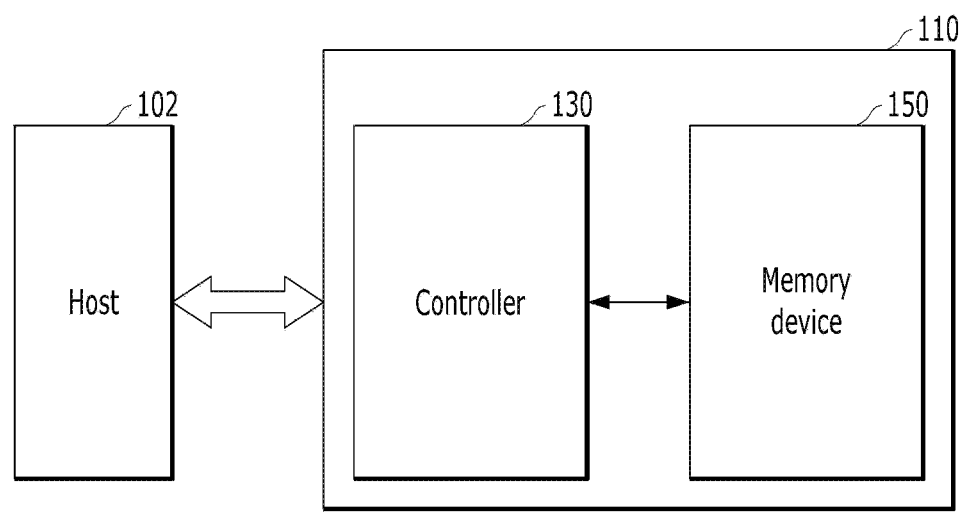
FIG. 1 is a diagram illustrating a memory system in accordance with an embodiment of the present disclosure.

Various examples of the present disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys this disclosure to those skilled in the art to which the invention pertains. Throughout this disclosure, like reference numerals refer to like parts throughout the various figures and examples of this disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of this disclosure. It will be further understood that terms, such as those defined in commonly used dictionaries, should be interpreted as having a meaning that is consistent with their meaning in the context of this disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the present disclosure are described in detail below with reference to the accompanying drawings, wherein like numbers reference like elements.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation.

Herein, the memory device 150 may include a memory cell array (not illustrated) including a plurality of memory cells that store data.

The memory cell array may include a plurality of memory blocks. Each of the memory blocks may include the plurality of memory cells. One memory block may include a plurality of pages. According to an embodiment, each of the pages may be a unit for storing data in the memory device 150 or reading data stored in the memory device 150. Each of the memory blocks may be a unit for erasing data.

According to an embodiment, the memory device 150 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM) or a spin transfer torque random access memory (SU-RAM). In the present disclosure, for convenience in description, the memory device 150 is a NAND flash memory, however, other types of memory devices may be used.

The memory device 150 may be configured to receive a command and an address from the controller 130 and access a region of the memory cell array selected by an address. The memory device 150 may perform an operation, corresponding to a command, on the region selected by the address. For example, the memory device 150 may perform a write operation, i.e., a program operation, a read operation and an erase operation. During the program operation, the memory device 150 may program data in the region selected by the address. During the read operation, the memory device 150 may read data from the region selected by the address. During the erase operation, the memory device 150 may erase data stored in the region selected by the address.

The controller 130 may control overall operations of the memory system 110.

When power is applied to the memory system 110, the controller 130 may execute firmware (FW). When the memory device 150 is a flash memory device, the firmware (FW) may include a host interface layer (HIL) that controls communication with the host 102, and the controller 130 may include a flash translation layer (FTL) that controls communication between the host 102 and the memory device 150, and a flash interface layer (FIL) that controls communication with the memory device 150.

According to an embodiment, the controller 130 may receive data and a logical block address (LBA) from the host 102, and convert the logical block address into a physical block address (PBA) indicating an address of a memory cell in which data included in the memory device 150 is to be stored. In an embodiment, the "logical block address (LBA)" and a "logical address" may be used as the same meaning. In an embodiment, the "physical block address (PBA)" and a "physical address" may be used as the same meaning.

The controller 130 may control the memory device 150 to perform the program, read or erase operation according to a request of the host 102. During the program operation, the controller 130 may provide the memory device 150 with a write command, a physical block address and data. During the read operation, the controller 130 may provide the memory device 150 with a read command and a physical block address. During the erase operation, the controller 130 may provide the memory device 150 with an erase command and a physical block address.

According to an embodiment, the controller 130 may generate a command, an address and data by itself regardless of a request of the host 102, and transmit the generated command, address, and data to the memory device 150. For example, the controller 130 may provide the memory device 150 with a command, an address, and data for performing the read and program operations accompanied for performing wear leveling, read reclaim, and garbage collection operations.

According to an embodiment, the controller 130 may control two or more memory devices 150. In this case, the controller 130 may control the memory devices 150 in an interleaving method to improve operational performance thereof. The interleaving method may be a method of controlling operations of two or more memory devices 150 to overlap each other.

The host 102 may communicate with the memory system 110 through at least one of various communication standards or protocols, such as universal serial bus (USB), serial advanced technology attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multi-media card (MMC), embedded MMC (eMMC), dual in-line memory module (DIMM), registered DIMM (RDIMM) and load reduced DIMM (LRDIMM).

Figure 2:
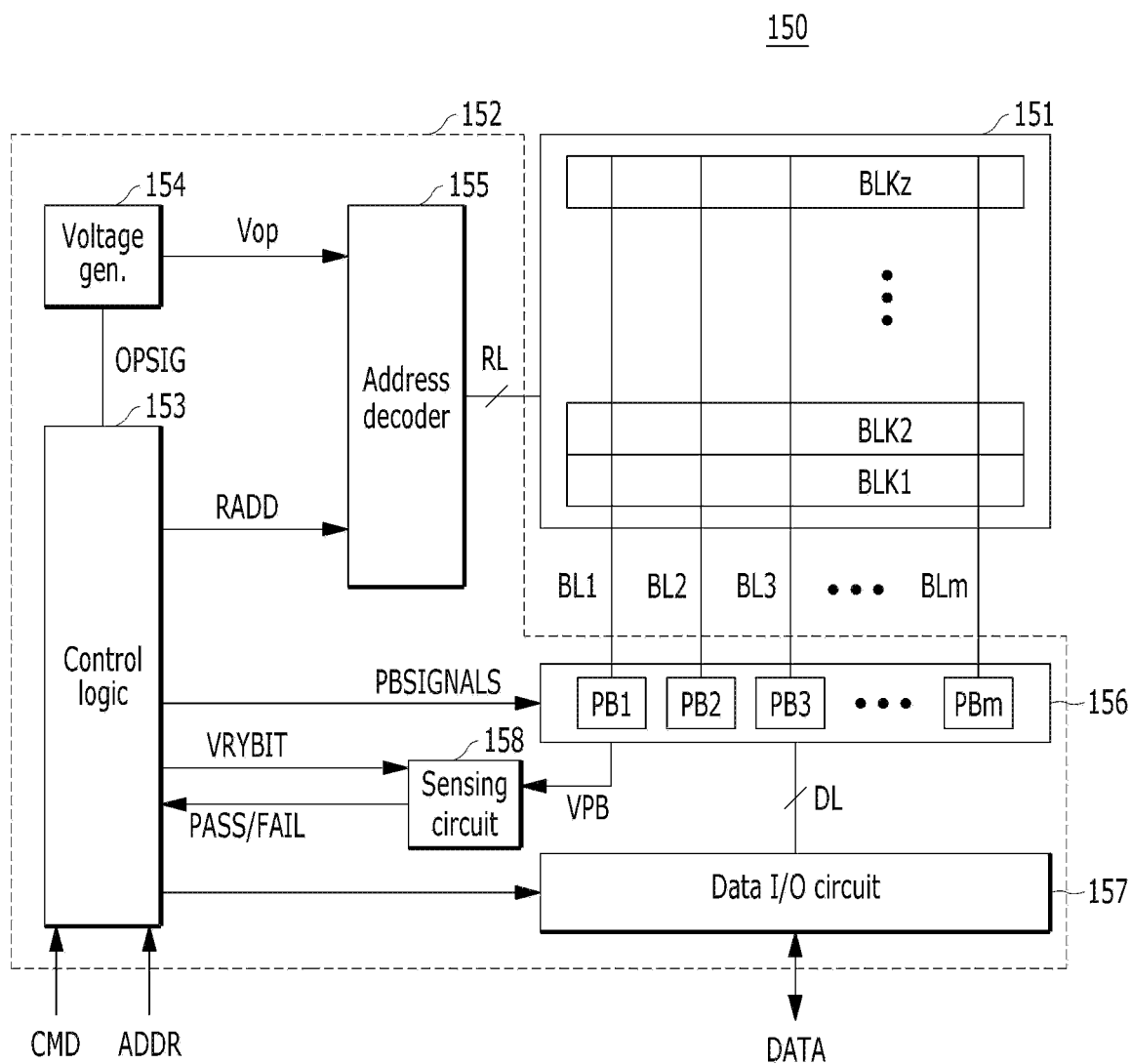
FIG. 2 is a detailed diagram illustrating a memory device illustrated in FIG. 1 in accordance with an embodiment of the present disclosure.

FIG. 2 is a detailed diagram illustrating the memory device 150 illustrated in FIG. 1 in accordance with an embodiment of the present disclosure.

Referring to FIG. 2, the memory device 150 may include a memory cell array 151 and a control circuit 152.

The memory cell array 151 may include a plurality of memory blocks BLK1 to BLKz. The plurality of memory blocks BLK1 to BLKz may be connected to an address decoder 155 through a row line RL. The plurality of memory blocks BLK1 to BLKz may be connected to a page buffer group 156 through a plurality of bit lines BL1 to BLm. Each of the memory blocks BLK1 to BLKz may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

The memory cells included in the memory cell array 151 may each be configured as a single level cell (SLC) storing 1-bit data, a multi-level cell (MLC) storing 2-bit data, a triple level cell (TLC) storing 3-bit data or a quad level cell (QLC) storing 4-bit data.

The control circuit 152 may be configured to perform a program, read or erase operation on a selected region of the memory cell array 151. The control circuit 152 may drive the memory cell array 151. For example, the control circuit 152 may apply various operating voltages to the row line RL and the bit lines BL1 to BLm, or discharge the applied voltages.

The control circuit 152 may include the address decoder 155, a voltage generator 154, the page buffer group 156, a data input/output circuit 157, a sensing circuit 158, and control logic 153.

The control circuit 152 may drive the memory cell array 151. For example, the control circuit 152 may drive the memory cell array 151 such that the memory cell array 151 performs the program, read and erase operations.

The address decoder 155 may be connected to the memory cell array 151 through the row line RL. The row line RL may include the drain selection line, the word lines, the source selection line and a common source line. According to an embodiment, the word lines may include a normal word line and a dummy word line. According to an embodiment, the row line RL may further include a pipe selection line.

The address decoder 155 may be configured to operate in response to the control of the control logic 153. The address decoder 155 may receive an address RADD from the control logic 153.

The address decoder 155 may be configured to decode a block address of the received address RADD. The address decoder 155 may select at least one memory block among the memory blocks BLK1 to BLKz according to the decoded block address. The address decoder 155 may be configured to decode a row address of the received address RADD. The address decoder 155 may select at least one word line among word lines of the selected memory block according to the decoded row address. The address decoder 155 may apply operating voltage Vop, which are supplied from the voltage generator 154, to the selected word line.

During the program operation, the address decoder 155 may apply a program voltage to the selected word line, and apply a pass voltage having a lower level than the program voltage to an unselected word line. During a program verification operation, the address decoder 155 may apply a verification voltage to the selected word line, and apply a verification pass voltage having a higher level than the verification voltage to the unselected word line.

During the read operation, the address decoder 155 may apply a read voltage to the selected word line, and apply a read pass voltage having a higher level than the read voltage to the unselected word line.

According to an embodiment, the erase operation of the memory device 150 may be performed in units of memory blocks. An address ADDR inputted to the memory device 150 during the erase operation may include a block address. The address decoder 155 may decode the block address, and select at least one memory block according to the decoded block address. During the erase operation, the address decoder 155 may apply a ground voltage to a word line connected to the selected memory block.

The voltage generator 154 may be configured to generate a plurality of operating voltages Vop by using an external power supply voltage supplied to the memory device 150. The voltage generator 154 may operate in response to the control of the control logic 153.

In an embodiment, the voltage generator 154 may regulate the external power supply voltage, and generate an internal power supply voltage. The internal power supply voltage generated by the voltage generator 154 may be used as an operating voltage of the memory device 150.

In an embodiment, the voltage generator 154 may generate the plurality of operating voltages Vop by using the external power supply voltage or the internal power supply voltage. The voltage generator 154 may be configured to generate various voltages required by the memory device 150. For example, the voltage generator 154 may generate a plurality of erase voltages, a plurality of program voltages, a plurality of pass voltages, a plurality of selective read voltages and a plurality of unselective read voltages.

The voltage generator 154 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic 153.

The generated operating voltages Vop may be supplied to the memory cell array 151 by the address decoder 155.

The page buffer group 156 may include a plurality of page buffers PB1 to PBm. The plurality of page buffers PB1 to PBm may be connected to the memory cell array 151 through the plurality of bit lines BL1 to BLm, respectively. The plurality of page buffers PB1 to PBm may operate in response to the control of the control logic 153.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

During the program operation, the plurality of page buffers PB1 to PBm may transmit the data DATA to be stored, which is received through the data input/output circuit 157, to the selected memory cell through the bit lines BL1 to BLm when the program voltage is applied to the selected word line. Memory cells of a selected page may be programmed according to the transmitted data DATA. A memory cell connected to a bit line BL to which a program allowable voltage, for example, a ground voltage, is applied may have a raised threshold voltage. A threshold voltage of a memory cell connected to a bit line BL to which a program inhibited voltage, for example, a power supply voltage, is applied may be maintained. During the program verification operation, the plurality of page buffers PB1 to PBm may read the data DATA, which is stored in the memory cell, from the selected memory cell through the bit lines BL1 to BLm.

During the read operation, the page buffer group 156 may read the data DATA from the memory cell of the selected page through the bit lines BLs, and store the read data DATA in the plurality of page buffers PB1 to PBm.

During the erase operation, the page buffer group 156 may float the bit lines BLs. In an embodiment, the page buffer group 156 may include a column selection circuit.

The data input/output circuit 157 may be connected to the plurality of page buffers PB1 to PBm through the data line DL. The data input/output circuit 157 may operate in response to the control of the control logic 153.

The data input/output circuit 157 may include a plurality of input/output buffers (not illustrated) that receive the data DATA inputted thereto. During the program operation, the data input/output circuit 157 may receive the data DATA, which is to be stored, from the controller 130 described with reference to FIG. 1. The data input/output circuit 157 may output the data DATA, which is transmitted from the plurality of page buffers PB1 to PBm included in the page buffer group 156, to the controller 130 during the read operation.

During the read operation or the verification operation, the sensing circuit 158 may generate a reference current in response to an allowable bit VRYBIT generated by the control logic 153, and output a pass signal PASS or a fail signal FAIL to the control logic 153 by comparing a sensing voltage VPB received from the page buffer group 156 with a reference voltage attributable to the reference current.

The control logic 153 may be connected to the address decoder 155, the voltage generator 154, the page buffer group 156, the data input/output circuit 157 and the sensing circuit 158. The control logic 153 may be configured to control overall operations of the memory device 150. The control logic 153 may operate in response to a command CMD transmitted from an external device.

The control logic 153 may generate various signals in response to the command CMD and the address ADDR, and control the other components 154 to 158 included in the control circuit 152. For example, the control logic 153 may generate an operation signal OPSIG, the address RADD, read and write circuit control signals PBSIGNALS and the allowable bit VRYBIT in response to the command CMD and the address ADDR. The control logic 153 may output the operation signal OPSIG to the voltage generator 154, output the address RADD to the address decoder 155, output the read and write control signals PBSIGNALS to the page buffer group 156, and output the allowable bit VRYBIT to the sensing circuit 158. In addition, the control logic 153 may determine whether the verification operation has passed or failed, in response to the pass or fail signal PASS or FAIL outputted by the sensing circuit 158.

Figure 3:
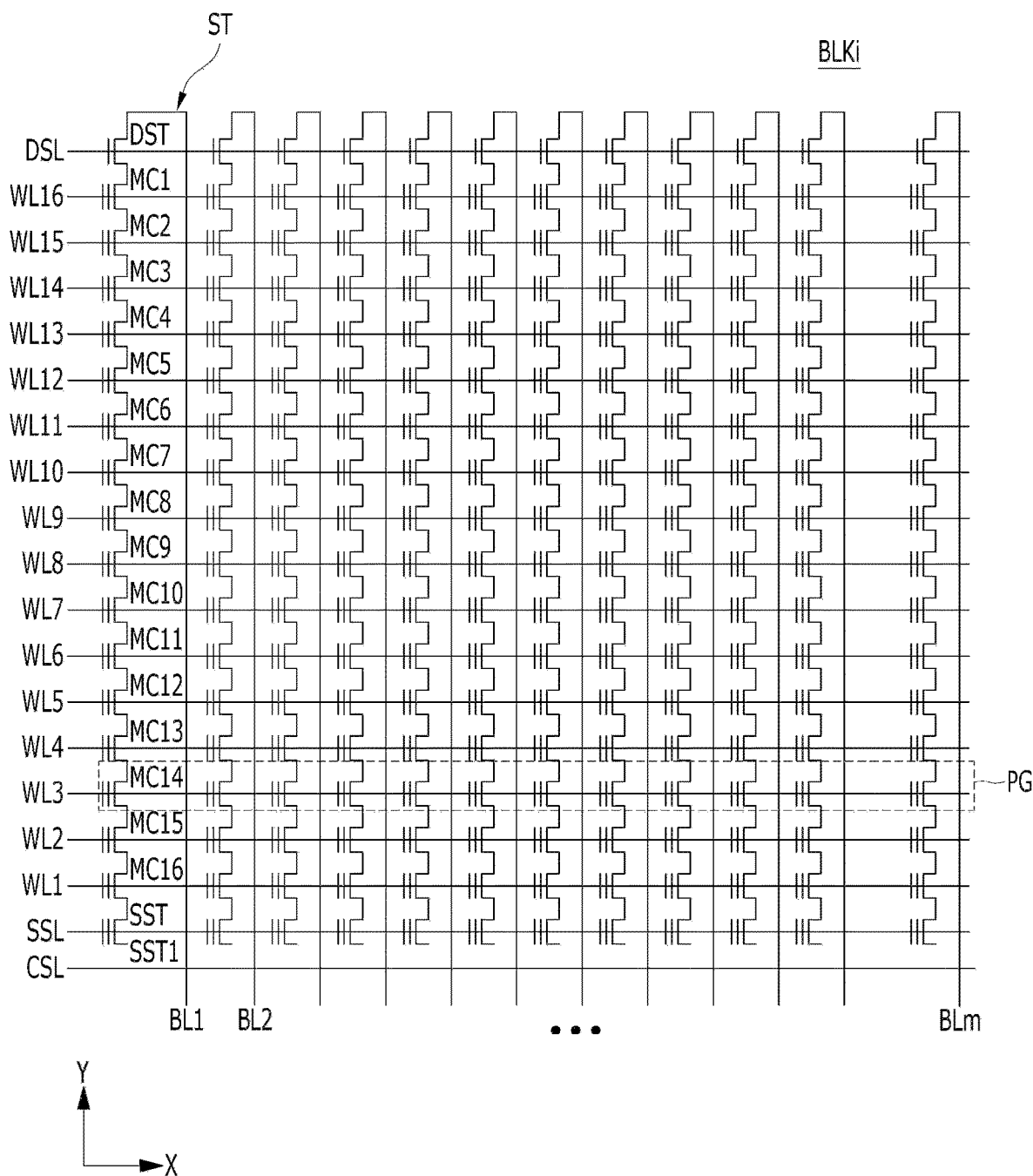
FIG. 3 is a detailed diagram illustrating a memory block illustrated in FIG. 2 in accordance with an embodiment of the present disclosure.

FIG. 3 is a detailed diagram illustrating a memory block illustrated in FIG. 2 in accordance with an embodiment of the present disclosure.

Referring to FIG. 3, a plurality of word lines arranged in parallel with one another may be connected between a first selection line and a second selection line. The first selection line may be a source selection line SSL, and the second selection line may be a drain selection line DSL. More specifically, a memory block BLKi may include a plurality of memory cell strings ST connected between the bit lines BL1 to BLm and a common source line CSL. The bit lines BL1 to BLm may be connected to the memory cell strings ST, respectively, and the common source line CSL may be connected to the memory cell strings ST in common. Since the memory cell strings ST may have the same configuration, the memory cell string ST connected to the first bit line BL1 is representatively described in detail.

The memory cell string ST may include a source selection transistor SST, a plurality of memory cells MC1 to MC16 and a drain selection transistor DST connected in series between the common source line CSL and the first bit line BL1. At least one drain selection transistor DST may be included in one memory cell string ST, and more source selection transistors SST and memory cells may be included than illustrated in the drawing.

A source of the source selection transistor SST may be connected to the common source line CSL, and a drain of the drain selection transistor DST may be connected to the first bit line BL1. The memory cells MC1 to MC16 may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MC16 may be connected to a plurality of word lines WL1 to WL16, respectively. A group of memory cells connected to the same word line among memory cells included in different memory cell strings ST may be referred to as a physical page PG. Accordingly, as many physical pages PG as the word lines WL1 to WL16 may be included in the memory block BLKi.

One memory cell may store 1-bit data. This is commonly referred to as a single level cell (SLC). In this case, one physical page PG may store one logical page (LPG) data. One logical page (LPG) data may include as many data bits as the cells included in one physical page PG.

One memory cell may store two or more bits of data. In this case, one physical page PG may store two or more logical page (LPG) data.

Although a memory block having a two-dimensional (2D) structure has been mainly described with reference to FIG. 3, the present disclosure is not limited to a case in which the memory device 150 includes memory blocks having the 2D structure. For example, the memory device 150 according to an embodiment may include memory blocks having a three-dimensional (3D) structure.

Figure 4:
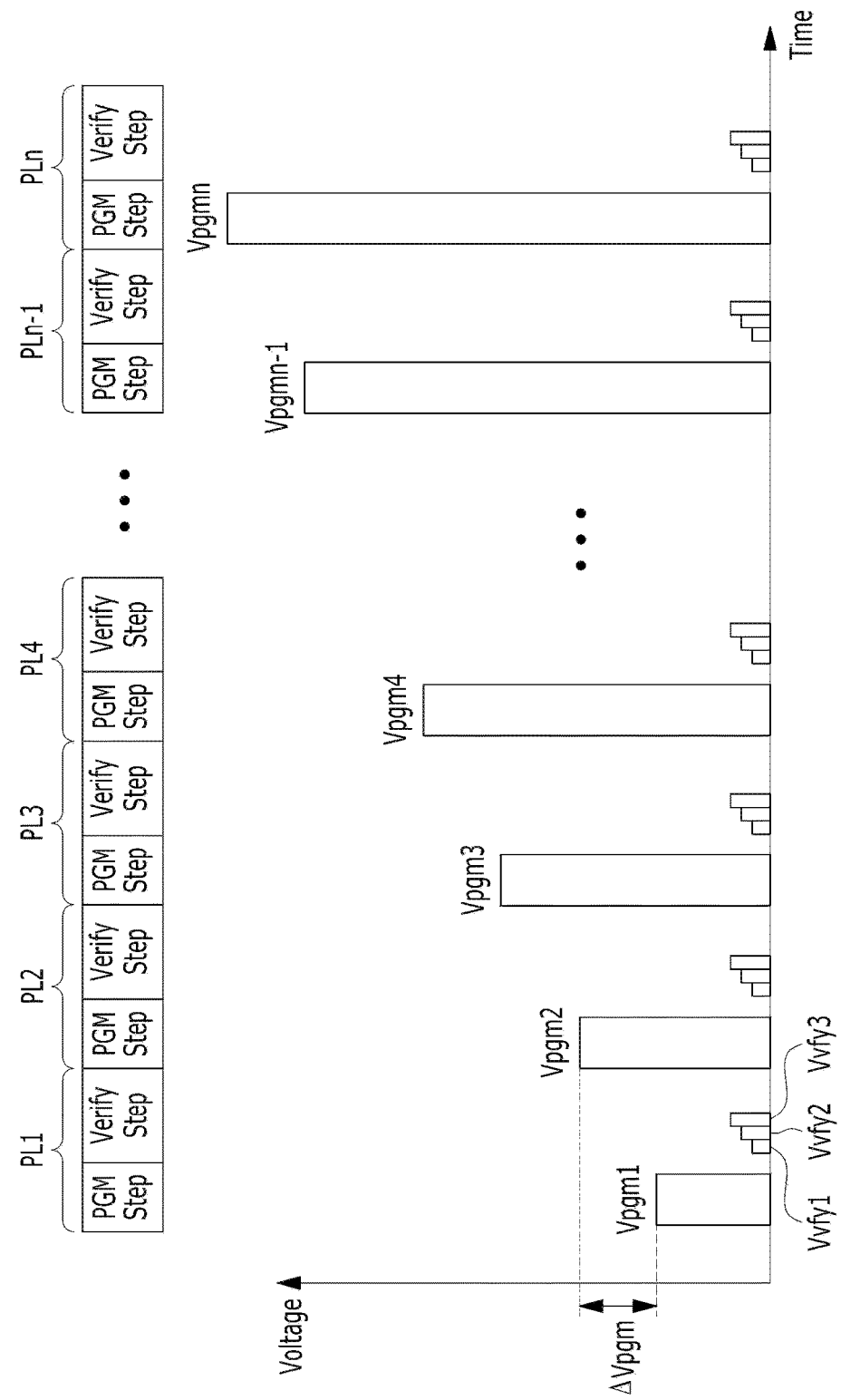
FIG. 4 is a diagram illustrating an incremental step pulse program (ISPP) operation in accordance with an embodiment of the present disclosure.

FIG. 4 is a diagram illustrating an incremental step pulse program (ISPP) operation in accordance with an embodiment of the present disclosure.

Referring to FIG. 4, the ISPP operation according to an embodiment may include a plurality of program loops PL1 to PLn. That is, the memory device 150 performing the ISPP operation may repeatedly perform the plurality of program loops PL1 to PLn one by one in a predetermined order until the program operation is completely performed, so that a selected memory cell may be programmed to have one of a plurality of program states.

Each of the program loops PL1 to PLn may include a program step (PGM Step) for applying a program voltage and a verification step (Verify Step) for applying a verification voltage and determining whether a selected memory cell is programmed to have a target program state.

In the program step, a program voltage applying operation of applying the program voltage to a selected word line connected to a memory cell selected as a program target may be performed. The memory cell selected through the program voltage applying operation may be programmed into one of the plurality of program states.

According to an embodiment, whenever each of the program loops PL1 to PLn is performed in the ISPP operation, a level of the program voltage may increase. That is, as each of the program loops PL1 to PLn is repeatedly performed, the level of the program voltage may increase in a stepwise manner by a predetermined increment in voltage. The number of times of application, voltage level and voltage applying time of the program voltage used in each of the program loops PL1 to PLn may be determined in various forms under the control of the control logic 153.

A program voltage may be applied to a word line selected as a program target. A pass voltage may be applied to unselected word lines except for the word line selected as the program target. The memory device 150 may include a plurality of memory blocks, and each of the plurality of memory blocks may include a plurality of word lines. Accordingly, among the plurality of word lines included in one memory block selected as the program target, the program voltage may be applied to the selected word line, and the pass voltage may be applied to remaining word lines as unselected word lines.

A program allowable voltage may be applied to a selected bit line connected to the memory cell selected as the program target. A program inhibited voltage may be applied to unselected bit lines connected to memory cells other than the memory cell selected as the program target. According to an embodiment, the program allowable voltage may be a ground voltage VSS, and the program inhibited voltage may be a power supply voltage VCORE.

Whenever each of the program loops PL1 to PLn is performed, a bit line precharge operation may be performed to precharge each of the plurality of bit lines BL1 to BLm connected to the plurality of memory cells to a predetermined potential level, for example, a program allowable potential level or a program inhibited potential level.

In a program verification step, the memory device 150 may apply a verification voltage to the word line selected as the program target, and apply a verification pass voltage to the unselected word lines. The memory device 150 may sense a voltage or a current outputted through a bit line to which each memory cell connected to the word line selected as the program target is connected, and determine whether the verification step is a pass or failure based on the sensing result.

In the program verification step, the program verification operation for at least one program state among a plurality of program states may be performed. For example, when a memory cell to be programmed into a kth program state (where "k" is a natural number equal to or greater than 1) is read as an off-cell by the verification voltage corresponding to the kth program state, the program verification operation for the kth program state may be passed.

In FIG. 4, when the memory cell selected as the program target is a multi-level cell (MLC) storing two-bit data, the selected memory cell may be programmed into any of four program states. The number of data bits stored in the memory cell is not limited to a multi-level cell (MLC) storing two-bit data as illustrated in FIG. 4.

When the first program loop PL1 is performed, a first program voltage Vpgm1 may be applied, and then first to third verification voltages Vvfy1 to Vvfy3 may be sequentially applied in order to verify the program states of the plurality of memory cells. In this case, a memory cell whose target state is a first program state may be verified by the first verification voltage Vvfy1, a memory cell whose target state is a second program state may be verified by the second verification voltage Vvfy2, and a memory cell whose target state is a third program state may be verified by the third verification voltage Vvfy3. The number of verification voltages is not limited to the present embodiment.

The memory cells that have been verified as "pass" by the first to third verification voltages Vvfy1 to Vvfy3 may be determined to have target states, and then be converted to program inhibited states in the second program loop PL2. A program inhibited voltage may be applied to bit lines connected to the program inhibited memory cells. A second program voltage Vpgm2 that is higher than the first program voltage Vpgm1 by a unit voltage ΔVpgm may be applied to a selected word line in the second program loop PL2.

The verification operation for the second program loop PL2 may be the same as the verification operation for the first program loop PL1. For example, a verification pass indicates that a memory cell is read as an off-cell by a corresponding verification voltage.

According to an embodiment, when the programming is not completed within a predetermined number of program operations, the ISPP operation may be determined as failure. When the programming is completed within the predetermined number of program operations, the ISPP operation may be determined as a pass. Whether or not the programming is completed may be determined by whether the program verification operations for memory cells occupying a predetermined ratio or higher among the memory cells selected as the program targets have passed.

Figure 5:
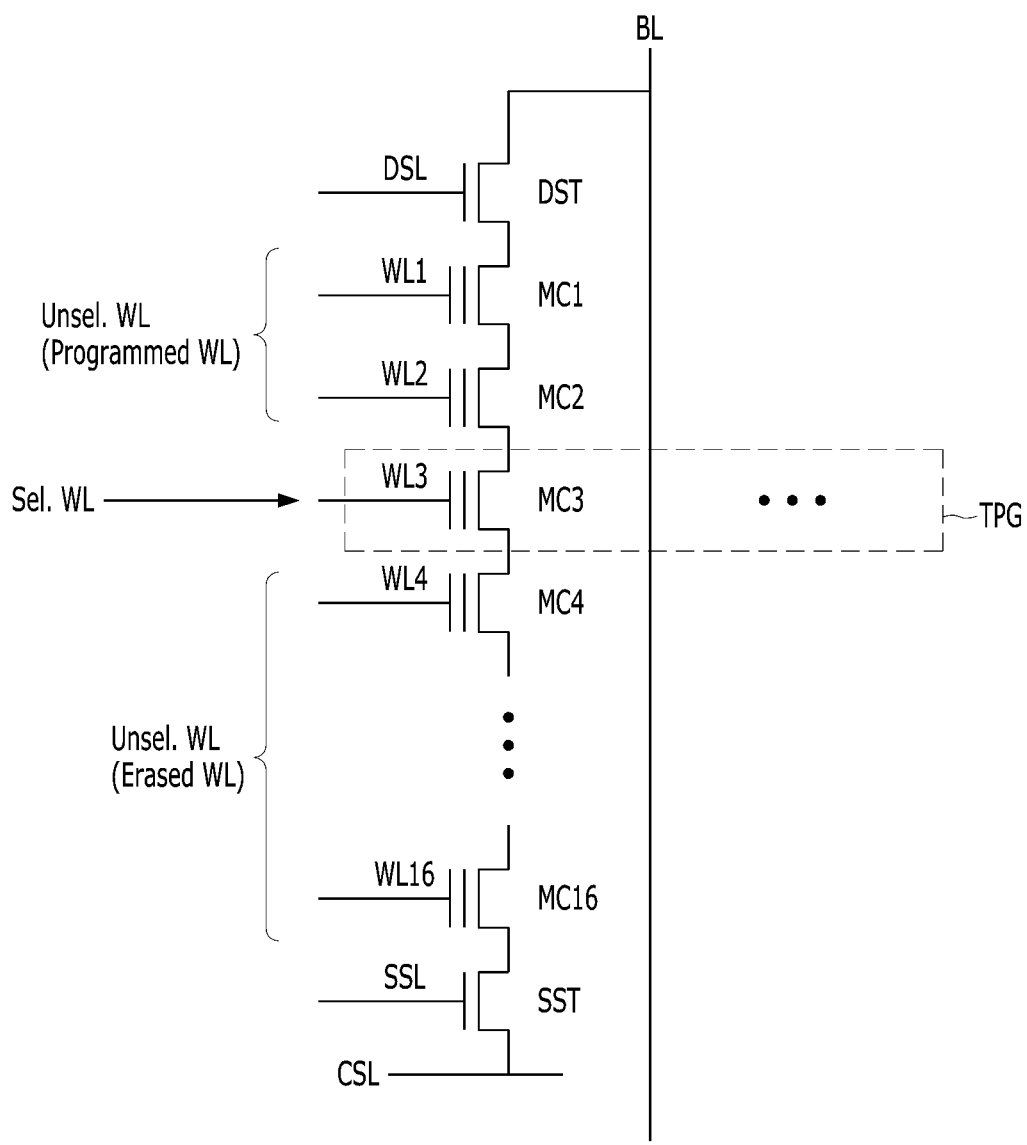
FIG. 5 is a diagram illustrating voltage supply for a verification operation of the memory device in accordance with an embodiment of the present disclosure.

FIG. 5 is a diagram illustrating voltage supply for a verification operation of the memory device 150 in accordance with an embodiment of the present disclosure. In an example of FIG. 5, a plurality of word lines WL1 to WL16 may be coupled to one memory cell string ST, and a third word line WL3 among the plurality of word lines WL1 to WL16 may be a selected word line (Sel. WL).

When the verification operation is performed, first to third verification voltages Vvfy1 to Vvfy3 may be sequentially applied to the third word line WL3 corresponding to the selected word line. In addition, a verification pass voltage may be applied to the other word lines, that is, unselected word lines (Unsel. WL) excluding the third word line WL3 among the plurality of word lines WL1 to WL16. Moreover, the plurality of word lines WL1 to WL16 may be sequentially programmed. The first and second word lines WL1 and WL2 among the unselected word lines may be programmed word lines, and the fourth to 16th word lines WL4 to WL16 among the unselected word lines may be erased word lines. A programmed word line is a word line coupled to memory cells, all of which are programmed, and an erased word line is a word line coupled to memory cells, all of which are erased.

When a result of the program operation indicates that a threshold voltage of a selected memory cell connected to the selected word line is higher than the verification voltages, the selected memory cell may be turned off, and when the result of the program operation indicates that the threshold voltage of the selected memory cell is lower than the verification voltages, the selected memory cell may be turned on.

When a plurality of selected memory cells are turned on, an excessive current may flow out through a common source line CSL, resulting in a source line bouncing phenomenon. The source line bouncing phenomenon may refer to a phenomenon in which the potential of the source line increases due to the excessive current flowing out through the common source line CSL. As the amount of current flowing out through the common source line CSL increases, the source line bouncing phenomenon may become more severe.

Even though the same amount of holes are introduced into a memory cell, a threshold voltage of the memory cell may be determined to have a different level when a voltage level of the source line is changed due to the source line bouncing phenomenon.

A change in the amount of current of the common source line CSL according to a value of a verification voltage applied to a selected word line and a program progress state is described in detail with reference to FIGS. 6A, 6B and 7A to 7C.

Figure 6A:
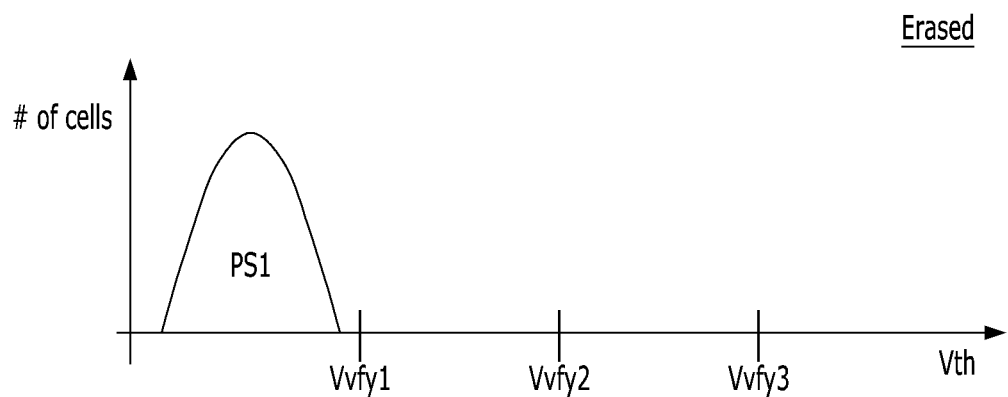
FIGS. 6A and 6B illustrate a memory cell distribution according to a threshold voltage in an MLC memory device in accordance with an embodiment of the present disclosure.
Figure 6B:
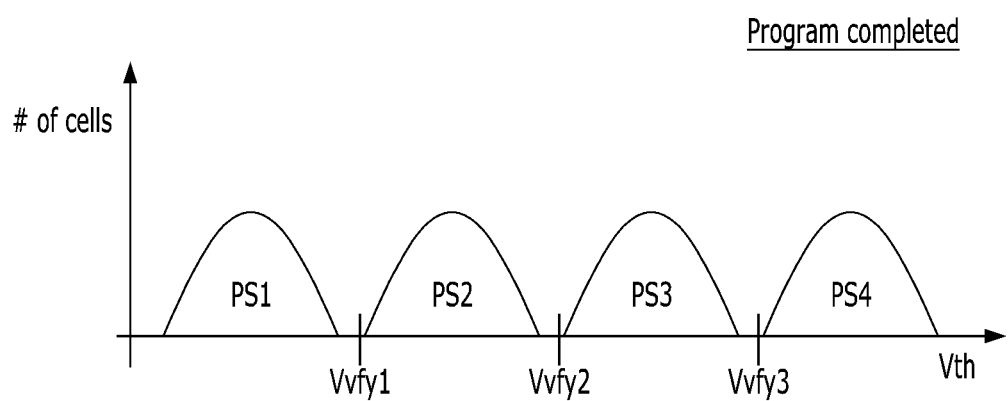

FIGS. 6A and 6B illustrate a memory cell distribution according to a threshold voltage in an MLC memory device in accordance with an embodiment of the present disclosure. Specifically, FIG. 6A illustrates the distribution of erased memory cells, and FIG. 6B illustrates the distribution of programmed memory cells.

In the graphs of FIGS. 6A and 6B, the horizontal axis indicates threshold voltages Vth of memory cells, and the vertical axis indicates the number of memory cells (# of cells) each having the corresponding threshold voltage. In FIG. 6A, the memory cells may all have a first program state PS1, that is, an erase state. When the memory cells all have the erase state, all of the memory cells may be determined to be on-cells even though one of first to third verification voltages Vvfy1 to Vvfy3 is applied to a selected word line.

In FIG. 6B, the memory cells may each have one of first to fourth program states PS1 to PS4. When the program operation is completely performed, the memory cells may be uniformly distributed for each program state. When the first verification voltage Vvfy1 is applied to the selected word line, approximately 25% of memory cells each having the first program state PS1 among all of the memory cells may be determined to be on-cells, and approximately 75% of memory cells each having one of the second to fourth program states PS2 to PS4 among all of the memory cells may be determined to be off-cells. Similarly, when the second verification voltage Vvfy2 is applied to the selected word line, approximately 50% of memory cells among all of the memory cells may be determined to be on-cells, and when the third verification voltage Vvfy3 is applied to the selected word line, approximately 75% of memory cells among all of the memory cells may be determined to be on-cells.

Referring to FIGS. 6A and 6B, the number of on-cells may vary depending on a value of a verification voltage applied to the selected word line and a program progress state.

Figure 7A:
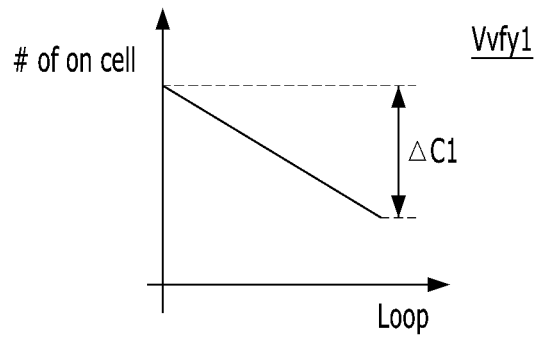
FIGS. 7A to 7C illustrate a value of a verification voltage applied to a selected word line and the number of on-cells according to a program progress state in accordance with an embodiment of the present disclosure.
Figure 7B:
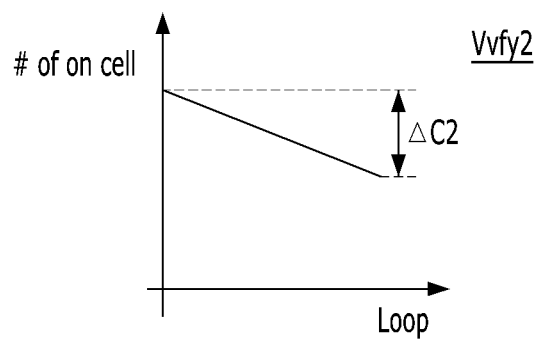
Figure 7C:
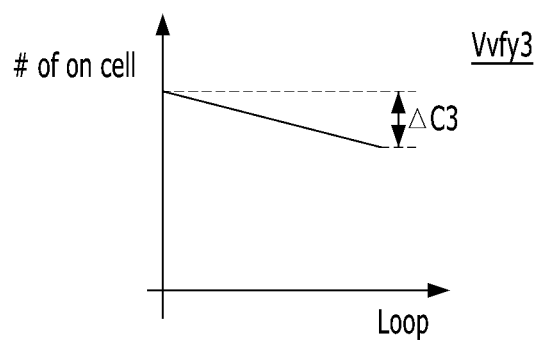

FIGS. 7A to 7C illustrate a value of a verification voltage applied to a selected word line and the number of on-cells according to a program progress state in accordance with an embodiment of the present disclosure. In the graphs of FIGS. 7A to 7C, the horizontal axis indicates a number of program loops, and the vertical axis indicates the number of on-cells in the corresponding program loop.

FIG. 7A illustrates the number of on-cells according to a program progress state when the first verification voltage Vvfy1 is applied. Since most of the memory cells each have the first program state PS1 in an initial program loop, most of the memory cells may be determined to be on-cells, but in a last program loop, only approximately 25% of memory cells may be determined to be on-cells. "ΔC1" illustrated in FIG. 7A represents a change in the number of on-cells in the initial and last program loops.

FIG. 7B illustrates the number of on-cells according to a program progress state when the second verification voltage Vvfy2 is applied. In an initial program loop, most of the memory cells may be determined to be on-cells, but in a last program loop, approximately 50% of memory cells may be determined to be on-cells. "ΔC2" illustrated in FIG. 7B represents a change in the number of on-cells in the initial and last program loops.

FIG. 7C illustrates the number of on-cells according to a program progress state when the third verification voltage Vvfy3 is applied. In an initial program loop, most of the memory cells may be determined to be on-cells, but in a last program loop, approximately 75% of memory cells may be determined to be on-cells. "ΔC3" illustrated in FIG. 7C represents a change in the number of on-cells in the initial and last program loops.

Referring to FIGS. 7A to 7C, the number of on-cells according to the number of program loops may change significantly as the verification voltage applied to the selected word line has a low value.

The amount of current flowing through a common source line CSL may be determined as the sum of the amounts of current flowing through on-cells, and be proportional to the number of on-cells. As the number of on-cells according to the program loops changes significantly, the amount of current flowing through the common source line CSL may also change significantly.

When the amount of current flowing through the common source line CSL changes significantly according to the number of program loops, a threshold voltage of a memory cell according to the number of program loops may change significantly even when the same amount of holes are introduced into the memory cell. When the threshold voltage of the memory cell according to the number of program loops changes significantly, a voltage distribution of memory cells that are completely programmed through each of the program loops may deteriorate, and reliability of the memory device 150 may be reduced.

Hereinafter, the memory device 150 capable of reducing a difference in potential of a source line according to the number of program loops is provided.

According to an embodiment, the memory device 150 may apply a verification pass voltage, which has different levels according to levels of a verification voltage applied to a selected word line, to an erased word line. The amount of current flowing through each of the plurality of bit lines BL1 to BLm may vary according to the levels of the verification pass voltage applied to the erased word line, and consequently, the amount of current flowing through the common source line CSL may vary. The memory device 150 may compensate for the difference in the potential of the source line according to the number of program loops by adjusting a level of an erase verification pass voltage. Accordingly, the width of a threshold voltage distribution of programmed memory cells may be narrowed, and the reliability of the memory device 150 may be improved.

An operation of the memory device 150 according to an embodiment is described in detail with reference to FIGS. 8, 9A to 9C, 10 and 11.

Figure 8:
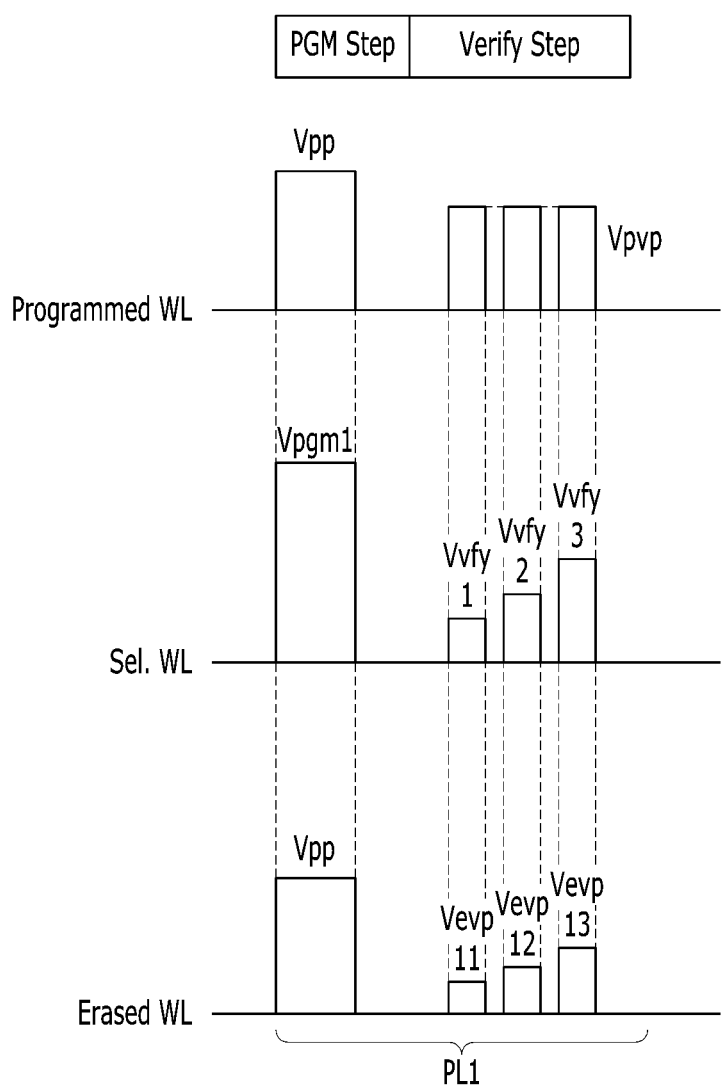
FIG. 8 is a diagram illustrating an operation of the memory device, using a first program loop PL1 as an example, in accordance with an embodiment of the present disclosure.

FIG. 8 is a diagram illustrating the operation of the memory device 150, using the first program loop PL1 as an example in accordance with an embodiment of the present disclosure.

As described with reference to FIG. 4, in one program loop, the memory device 150 may apply a program voltage to a selected word line, and then apply verification voltages for each program state.

In a program step of the first program loop PL1, the memory device 150 may apply a program pass voltage Vpp to unselected word lines while applying the first program voltage Vpgm1 to the selected word line. The program pass voltage Vpp may have a level sufficient to turn on all unselected memory cells connected to the unselected word lines, but have a lower level than the first program voltage Vpgm1.

In a verification step of the first program loop PL1, the memory device 150 may sequentially apply the first to third verification voltages Vvfy1 to Vvfy3 to the selected word line. The memory device 150 may apply a verification pass voltage to the unselected word lines while sequentially applying the first to third verification voltages Vvfy1 to Vvfy3 to the selected word line.

According to an embodiment, the memory device 150 may apply the verification pass voltage having a higher level than the first to third verification voltages Vvfy1 to Vvfy3 to a programmed word line of the unselected word lines. Hereinafter, the verification pass voltage applied to the programmed word line may be referred to as a program verification pass voltage Vpvp. The program verification pass voltage Vpvp may have a level sufficient to turn on all programmed unselected memory cells, that is, a higher level than threshold voltages of all of the programmed unselected memory cells.

According to an embodiment, the memory device 150 may apply a verification pass voltage, which has a different level according to the values of the first to third verification voltages Vvfy1 to Vvfy3, to an erased word line of unselected word lines. Hereinafter, the verification pass voltage applied to the erased word line may be referred to as an erase verification pass voltage. The erase verification pass voltage may have a level sufficient to turn on erased memory cells connected to the erased word line, and have a lower level than the program verification pass voltage Vpvp.

While applying a verification voltage having a gradually increasing level to the selected word line, the memory device 150 may apply an erase verification pass voltage having a gradually increasing level to the erased word line. In an example of FIG. 8, while sequentially applying the first to third verification voltages Vvfy1 to Vvfy3 to the selected word line, the memory device 150 may sequentially apply Vevp11, Vevp12 and Vevp13 as first to third erase verification pass voltages to the erased word line.

As a level of the erase verification pass voltage becomes lower, the amount of current flowing through the common source line CSL may also decrease. The memory device 150 may apply the erase verification pass voltage having a relatively low level when the verification voltage having a relatively low level is applied. When the level of the erase verification pass voltage becomes lower, a change in the amount of current flowing through the common source line CSL may be alleviated even though the number of on-cells according to the program loops when the verification voltage is applied changes significantly.

Figure 9A:
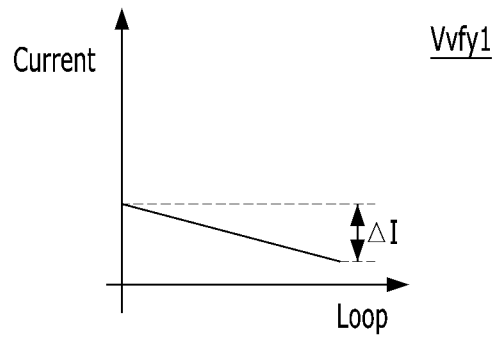
FIGS. 9A to 9C are diagrams illustrating that a change in the amount of current flowing through a common source line is alleviated in accordance with an embodiment of the present disclosure.
Figure 9B:
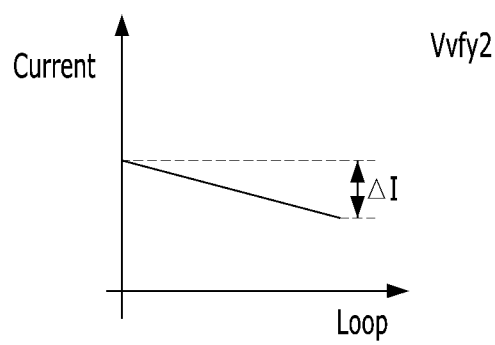
Figure 9C:
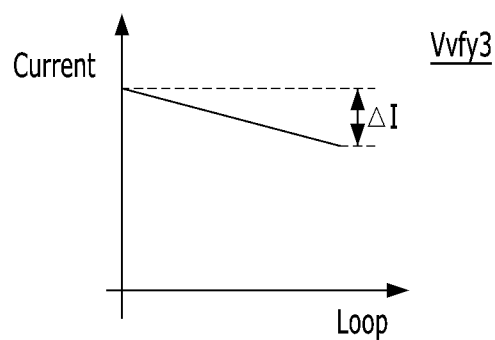

FIGS. 9A to 9C are diagrams illustrating that the change in the amount of current flowing through the common source line CSL is alleviated in accordance with an embodiment of the present disclosure. In the graphs of FIGS. 9A to 9C, the horizontal axis indicates a number of program loops, and the vertical axis indicates the amount of current flowing through the common source line CSL.

FIG. 9A illustrates a current flowing through the common source line CSL when the first verification voltage Vvfy1 is applied, FIG. 9B illustrates a current flowing through the common source line CSL when the second verification voltage Vvfy2 is applied, and FIG. 9C illustrates a current flowing through the common source line CSL when the third verification voltage Vvfy3 is applied.

As a verification voltage having a low level is applied to a selected word line, an erase verification pass voltage having a low level may be applied to an erased word line, and the amount of current flowing through the common source line CSL may be reduced. When the amount of current flowing through the common source line CSL is reduced, a change in the amount of current according to the program loops may be alleviated.

Comparing FIGS. 9A to 9C, when the third verification voltage Vvfy3 is applied, the amount of current flowing through the common source line CSL may be the largest, the amount of current flowing through the common source line CSL may be smaller in the order of the second verification voltage Vvfy2 and the first verification voltage Vvfy1. The number of on-cells when the first verification voltage Vvfy1 is applied may vary greatly depending on the number of program loops, but since the current flowing through the common source line CSL is suppressed, a change ΔI in the amount of current flowing through the common source line CSL may be alleviated.

Whenever the program loops proceed, threshold voltages of selected memory cells may increase. Referring back to FIGS. 7A to 7C, as the program loops proceed, the number of on-cells among the selected memory cells may decrease. When the number of on-cells decreases, the amount of current flowing through the common source line CSL may decrease.

According to an embodiment, the memory device 150 may increase levels of first to third erase verification pass voltages whenever the program loops proceed, thereby compensating for the amount of current flowing through the common source line CSL, which decreases according to the decrease in the number of on-cells.

Figure 10:
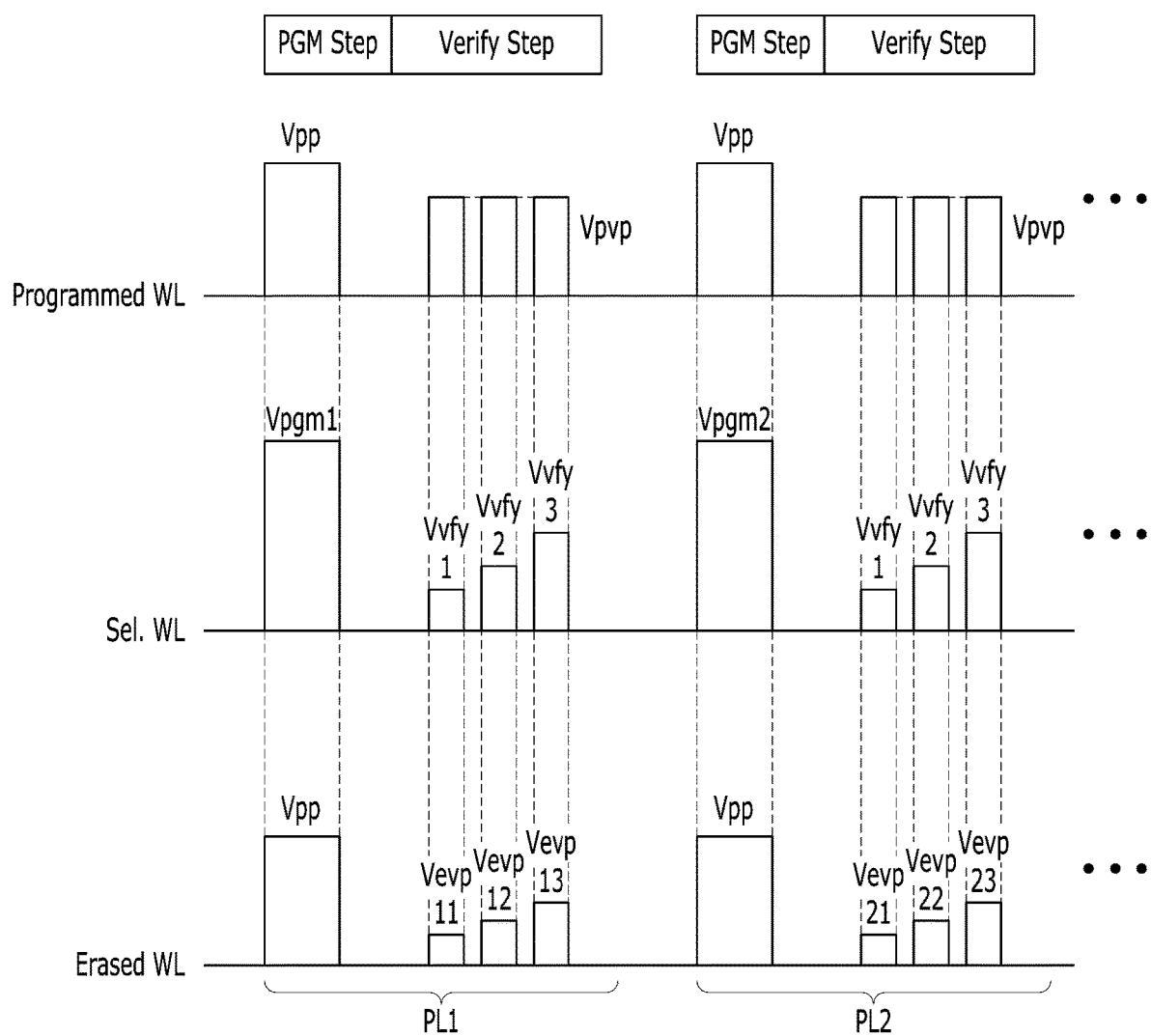
FIG. 10 is a diagram illustrating an operation of the memory device, using first and second program loops as examples, in accordance with an embodiment of the present disclosure.

FIG. 10 is a diagram illustrating the operation of the memory device 150, using the first and second program loops PL1 and PL2 as an example, in accordance with an embodiment of the present disclosure.

Voltages for each word line in the first program loop PL1 illustrated in FIG. 10 may be the same as those illustrated in FIG. 8.

During a program operation of the second program loop PL2, the memory device 150 may apply the second program voltage Vpgm2 having a higher level than the first program voltage Vpgm1 to a selected word line. The memory device 150 may apply a program pass voltage Vpp to unselected word lines while applying the second program voltage Vpgm2 to the selected word line.

During a verification operation of the second program loop PL2, the memory device 150 may sequentially apply the first to third verification voltages Vvfy1 to Vvfy3 to the selected word line, and apply first to third ease verification pass voltages Vevp21, Vevp22 and Vevp23 to the unselected word lines. The memory device 150 may apply, as the first to third erase verification pass voltages Vevp21, Vevp22 and Vevp23 having higher levels than the first to third erase verification pass voltages Vevp11, Vevp12 and Vevp13 to an erased word line. The memory device 150 may increase the levels of the first to third erase verification pass voltages whenever the program loops proceed, thereby compensating for a decrease in the amount of current flowing through the common source line CSL. Accordingly, the change ΔI in the amount of current flowing through the common source line CSL according to the program loops may be further reduced, and the distribution of programmed memory cells may be more sophisticated.

According to an embodiment, the memory device 150 may consider an additional factor to determine the erase verification pass voltages capable of maintaining a constant current flowing through the common source line CSL when the verification voltages are applied.

As a first example, the memory device 150 may apply an erase verification pass voltage having a lower level as the number of erased word lines decreases in a memory block. Whenever word lines of the memory block are programmed one by one, the number of erased word lines to which the erase verification pass voltage can be applied may gradually decrease. When the memory device 150 applies the erase verification pass voltage having a lower level as the number of erased word lines decreases, a change in the amount of current flowing through the common source line CSL may be more effectively suppressed.

As a second example, the memory device 150 may apply an erase verification pass voltage having a higher level as an erase/write (E/W) cycle of a memory block increases. As the E/W cycle of the memory block increases, memory cells may deteriorate, and when selected memory cells are programmed or read, disturbances in which threshold voltages of neighboring memory cells increase may become severe. As the E/W cycle increases, the threshold voltages of the neighboring memory cells may increase, and the amount of current flowing through the plurality of bit lines BL1 to BLm may decrease during the verification operation. The memory device 150 may apply the erase verification pass voltage having a higher level to an erased word line as the E/W cycle increases, to compensate for the amount of current that decreases as the E/W cycle increases.

Depending on implementations, the memory device 150 may determine a value of the erase verification pass voltage by referring to one or more lookup tables.

FIG. 11 is a diagram illustrating lookup tables each including program loops of the memory device 150 and a verification voltage for each program state in accordance with an embodiment of the present disclosure.

According to an embodiment, the memory device 150 may select any of first to third lookup tables 1102, 1104 and 1106 according to an E/W cycle of a memory block to be programmed. The memory device 150 may determine a level of an erase verification pass voltage to be applied in a verification step by referring to the selected lookup table.

FIG. 11 illustrates the first lookup table 1102. The first lookup table 1102 may include verification voltages and an erase verification pass voltage for each program loop. "ΔV" and "ΔV2" illustrated in the first lookup table 1102 are arbitrary constants.

Referring to the first lookup table 1102, the erase verification pass voltage for each program loop may have a high level in the order of first to third verification voltages Vvfy1 to Vvfy3. In addition, the erase verification pass voltage for each verification voltage may have a high level in the order of first to fifth program loops PL1 to PL5.

According to the present embodiment, as a level of a verification voltage applied to a selected word line increases, the memory device 150 may apply a verification pass voltage having a higher level to erased word lines. For example, the memory device 150 may apply the first verification voltage Vvfy1 to the selected word line, and apply a first verification pass voltage to the erased word lines, to verify a first program state of selected memory cells. In addition, the memory device 150 may apply the second verification voltage Vvfy2 having a higher level than the first verification voltage Vvfy1 to the selected word line, and apply a second verification pass voltage having a higher level than the first verification pass voltage to the erased word lines, to verify a second program state higher than the first program state of the selected memory cells. The first and second verification pass voltages may have lower values than a program pass voltage Vpp applied to a word line that is completely programmed. According to an embodiment, a change in the amount of current flowing through the common source line CSL for each program loop may be reduced.

According to an embodiment, the memory device 150 may increase the levels of the first and second verification pass voltages whenever the program loop is repeated, thereby further reducing the change in the amount of current flowing through the common source line CSL for each program loop. Accordingly, the memory cell distribution may be sophisticated, and the reliability of the memory device 150 may be improved.

According to embodiments of the present disclosure, it is possible to provide a memory device capable of narrowing a width of a threshold voltage distribution of programmed memory cells despite a source line bouncing phenomenon, and an operating method thereof.

Although a memory device and an operating method thereof have been described with reference to the specific embodiments, these are merely examples, and the present disclosure is not limited thereto, and should be interpreted to have the widest scope according to the basic idea disclosed in the present specification. Those skilled in the art may carry out unspecified embodiments by combining and substituting the disclosed embodiments, but these also do not depart from the scope of the present disclosure. In addition, those skilled in the art may easily change or modify the embodiments disclosed based on the present specification, and it is apparent that such changes or modifications also fall within the scope of the present disclosure and the following claims. Furthermore, the embodiments may be combined to form additional embodiments.

What is claimed is:

1. An operating method of a memory device, comprising:
   a program operation of applying a program voltage to a selected word line to program selected memory cells connected to the selected word line;
   a first verification operation of applying a first verification voltage to the selected word line and applying a first verification pass voltage to unselected word lines to verify a first program state of the selected memory cells; and
   a second verification operation of applying a second verification voltage, which has a higher level than the first verification voltage, to the selected word line and applying a second verification pass voltage, which has a higher level than the first verification pass voltage, to the unselected word lines to verify a second program state higher than the first program state of the selected memory cells.

2. The operating method of claim 1, further comprising an operation of repeating a program loop including the program operation, the first verification operation, and the second verification operation until the first program state and the second program state are verified while increasing a level of each of the first verification pass voltage and the second verification pass voltage.

3. The operating method of claim 1,
wherein the unselected word lines are erased word lines,
wherein each of the first verification operation and the second verification operation includes applying a third verification pass voltage to programmed word lines, and
wherein the third verification pass voltage has a higher level than the first verification pass voltage and the second verification pass voltage.

4. The operating method of claim 3, wherein the third verification pass voltage has a higher level than threshold voltages of memory cells connected to the programmed word lines.

5. The operating method of claim 3, further comprising an operation of determining levels of the first verification pass voltage and the second verification pass voltage according to a number of erased word lines of a memory block including the selected word line.

6. The operating method of claim 5, wherein the operation of determining the levels of the first verification pass voltage and the second verification pass voltage includes determining the levels of the first verification pass voltage and the second verification pass voltages as lower levels as the number of erased word lines decreases.

7. The operating method of claim 1, further comprising an operation of determining levels of the first verification pass voltage and the second verification pass voltage according to erase/write (E/W) cycles of a memory block including the selected memory cells.

8. The operating method of claim 7, wherein the operation of determining the levels of the first verification pass voltage and the second verification pass voltage includes determining the levels of the first verification pass voltage and the second verification pass voltage as higher levels as the E/W cycles increase.

9. The operating method of claim 7, wherein the operation of determining the levels of the first verification pass voltage and second verification pass voltages includes:
selecting one of a plurality of lookup tables according to the E/W cycles; and
determining the levels of the first verification pass voltage and the second verification pass voltage in a current program loop by referring to the selected lookup table.

10. The operating method of claim 1, wherein a memory block including the selected memory cells has a three-dimensional structure.

11. A memory device comprising:
a memory block including a plurality of memory cells connected to a plurality of word lines; and
a control circuit configured to:
program selected memory cells connected to a selected word line among the plurality of word lines by applying a program voltage to the selected word line,
apply a first verification pass voltage to unselected word lines while applying a first verification voltage to the selected word line to verify a first program state of the selected memory cells, and
apply a second verification pass voltage, which is higher than the first verification pass voltage to the unselected word lines while applying a second verification voltage, which is higher than the first verification voltage to the selected word line to verify a second program state higher than the first program state of the selected memory cells.

12. The memory device of claim 11, wherein the control circuit is further suitable for repeating a program loop including the programming and the verifying of the first program state and the second program state until the first program state and the second program state are verified while increasing a level of each of the first verification pass voltage and the second verification pass voltage.

13. The memory device of claim 11,
wherein the unselected word lines are erased word lines,
wherein the control circuit is further suitable for applying a third verification pass voltage to programmed word lines during each verification of the first program state and the second program state of the selected memory cells, and
wherein the third verification pass voltage has a higher level than the first verification pass voltage and the second verification pass voltage.

14. The memory device of claim 13, wherein the third verification pass voltage has a higher level than threshold voltages of memory cells connected to the programmed word lines.

15. The memory device of claim 11, wherein the control circuit is further suitable for determining levels of first verification pass voltage and the second verification pass voltage according to a number of erased word lines of the memory block.

16. The memory device of claim 15, wherein the control circuit determines the levels of the first verification pass voltage and the second verification pass voltage as lower levels as the number of erased word lines decreases.

17. The memory device of claim 11, wherein the control circuit is further suitable for determining levels of the first verification pass voltage and the second verification pass voltage according to erase/write (E/W) cycles of the memory block including the selected memory cells.

18. The memory device of claim 17, wherein the control circuit determines the levels of the first verification pass voltage and the second verification pass voltage as higher levels as the E/W cycles increase.

19. The memory device of claim 17, wherein the control circuit determines the levels of the first verification pass voltage and the second verification pass voltage in a current program loop by selecting one of a plurality of lookup tables according to the E/W cycles and referring to the selected lookup table.

20. The memory device of claim 11, wherein the memory block has a three-dimensional structure.

* * * * *